(12) United States Patent
R et al.

(10) Patent No.: US 10,725,118 B2
(45) Date of Patent: Jul. 28, 2020

(54) FLOATING INPUT DETECTION

(71) Applicant: TEXAS INSTRUMENTS INCORPORATED, Dallas, TX (US)

(72) Inventors: Dileep Kumar R, Bengaluru (IN); Srihari Varma Datla, Bengaluru (IN); Dipankar Mandal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 146 days.

(21) Appl. No.: 16/124,261

(22) Filed: Sep. 7, 2018

(65) Prior Publication Data

US 2019/0302163 A1    Oct. 3, 2019

(30) Foreign Application Priority Data

Mar. 28, 2018    (IN) .............................. 201841011581

(51) Int. Cl.

| | |
|---|---|
| *G01R 19/145* | (2006.01) |
| *G01R 31/02* | (2006.01) |
| *G01R 31/50* | (2020.01) |
| *H03F 3/68* | (2006.01) |
| *H03K 5/24* | (2006.01) |
| *H03F 3/45* | (2006.01) |

(52) U.S. Cl.
CPC ......... *G01R 31/50* (2020.01); *H03F 3/45071* (2013.01); *H03F 3/68* (2013.01); *H03K 5/24* (2013.01); *H03F 2200/129* (2013.01); *H03F 2200/471* (2013.01); *H03F 2203/45116* (2013.01)

(58) Field of Classification Search
CPC ...... G01R 19/10; G01R 19/252; G01R 31/02; G01R 31/025; G01R 31/50; H03F 3/45; H03F 3/68; H03K 5/24; H03K 5/19; H03M 1/12; H03M 1/14; H03M 1/46; H03M 1/66; H03M 1/1225
See application file for complete search history.

(56) References Cited

U.S. PATENT DOCUMENTS

| | | | |
|---|---|---|---|
| 5,161,175 A | 11/1992 | Parker et al. | |
| 5,469,086 A | 11/1995 | Bahng et al. | |
| 7,233,473 B2 * | 6/2007 | Donaldson | .............. H02M 3/07 361/103 |

(Continued)

OTHER PUBLICATIONS

International Search Report in corresponding PCT Application No. PCT/US2019/024500, dated Aug. 8, 2019 (2 pages).

*Primary Examiner* — Minh N Tang
(74) *Attorney, Agent, or Firm* — John R. Pessetto; Charles A. Brill; Frank D. Cimino

(57) ABSTRACT

A floating input detection method and circuits. A method for detecting a floating signal input terminal includes providing a common-mode input voltage to a first amplifier coupled to the signal input terminal, and providing an output signal generated by the first amplifier to: a non-inverting input of a second amplifier coupled to the signal input terminal, an inverting input of the second amplifier, coarse detection circuitry, and fine float detection circuitry. The method also includes comparing, by the coarse detection circuitry, the output signal to a first threshold voltage, and determining the signal input terminal to be not floating responsive to the comparing indicating that the output signal is greater than the first threshold voltage.

20 Claims, 7 Drawing Sheets

(56) References Cited

U.S. PATENT DOCUMENTS

| | | | |
|---|---|---|---|
| 8,390,374 B2 * | 3/2013 | Alexander | H03F 3/45475 330/147 |
| 8,587,461 B1 | 11/2013 | Mitchell | |
| 2001/0050714 A1 | 12/2001 | Haraguchi | |

* cited by examiner

US 10,725,118 B2

FLOATING INPUT DETECTION

CROSS-REFERENCE TO RELATED APPLICATIONS

The present application claims priority to India Provisional Patent Application No. 201841011581, filed Mar. 28, 2018, titled "Real Time Detection of Floating Input of Data Acquisition System," which is hereby incorporated herein by reference in its entirety.

BACKGROUND

In an electronic device, a floating input terminal, is an input terminal to which no signal is applied, e.g., an input terminal to which no source or sink is connected (e.g., a voltage source, a current source, a resistor, etc.). A floating input terminal can indicate a fault condition in or unintended disconnection of drive circuitry from the input terminal. Floating input terminals can also cause undesirable effects in an electronic device. For example, a floating input terminal can result in excessive current flow in input circuitry of an electronic device.

SUMMARY

A method and circuitry for detecting a floating input terminal, and a data acquisition system employing such circuitry, are disclosed herein. In one example, a data acquisition system includes a signal input terminal, an analog-to-digital converter (ADC), an analog front end (AFE) circuit, and floating input detection circuitry. The AFE circuit is coupled to the ADC and the signal input terminal. The AFE circuit includes a programmable gain amplifier, and a common mode amplifier. The common mode amplifier is coupled to the programmable gain amplifier. The common mode amplifier includes a first input, a second input, a third input, and an output. The first input is coupled to a non-inverting input of the programmable gain amplifier. The second input is coupled to an inverting input of the programmable gain amplifier. The third input is to receive a common-mode input voltage. The output is coupled to the non-inverting input and the inverting input of the programmable gain amplifier. The floating input detection circuitry is coupled to the AFE circuit.

In another example, a method for detecting a floating signal input terminal includes providing a common-mode input voltage to a first amplifier coupled to the signal input terminal, and providing an output signal generated by the first amplifier to: a non-inverting input of a second amplifier coupled to the input terminal, an inverting input of the second amplifier, coarse detection circuitry, and fine float detection circuitry. The method also includes comparing, by the coarse detection circuitry, the output signal to a first threshold voltage, and determining the signal input terminal to be not floating responsive to the comparing indicating that the output signal is greater than the first threshold voltage.

In a further example, a circuit for detecting a floating input includes a signal input terminal, a reference terminal, a first amplifier, a second amplifier, and float detection circuitry. The first amplifier includes an inverting input coupled to the reference terminal, and a non-inverting input coupled to the signal input terminal. The second amplifier includes a first input, a second input, and an output. A non-inverting output and an inverting output of the first amplifier are coupled to the first input or the second input. The output of the second amplifier is coupled to the inverting input of the first amplifier, and to the non-inverting input of the first amplifier. The float detection circuitry includes a digital-to-analog converter, a first comparator, a second comparator, and control circuitry. The digital-to-analog converter includes a first output that is coupled to one of the first amplifier or the second amplifier. The first comparator includes a first input and a second input. The first input is coupled to the output of the second amplifier. The second input is coupled to a second output of the digital-to-analog converter. The second comparator includes a first input and a second input. The first input is coupled to the output of the second amplifier. The second input is coupled to a third output of the digital-to-analog converter. The control circuitry includes a first input, a second input, a first output, and a second output. The first input is coupled to an output of the first comparator. The second input is coupled to an output of the second comparator. The first output is coupled to an input of the digital-to-analog converter. The second output is to indicate whether the input terminal is floating.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Because floating inputs can cause undesirable effects and/or indicate a malfunction of circuitry driving the input, detection of floating input terminals is desirable. Various techniques of floating input detection have been implemented. Some implementations add detection circuity that taps the input terminal, which can affect input terminal impedance, and may require the use of high voltage process components if the input signals are high voltage. Other implementations monitor the behavior of signal at an input terminal, via digital samples of the signal, over a long period of time, which slows detection. Some systems implement dedicated detection cycles that halt normal circuit operation, for a time, for float detection.

The floating input detection circuits and methods disclosed herein quickly detect floating input terminals without affecting terminal impedance, without requiring dedicated detection cycles, and without use of high voltage process components. Implementations of the floating input detection circuitry monitor the gain of a common mode amplifier stage in the analog front end (AFE) coupled to an input terminal. The gain of the common mode amplifier stage is a function of whether the input terminal is floating or not. Implementations test the common mode amplifier stage gain by varying a common mode input voltage. The common mode input voltage is rejected in the AFE and therefore varying the common mode input voltage to determine whether the input is floating has little or no effect on the performance of the AFE.

Figure 1:
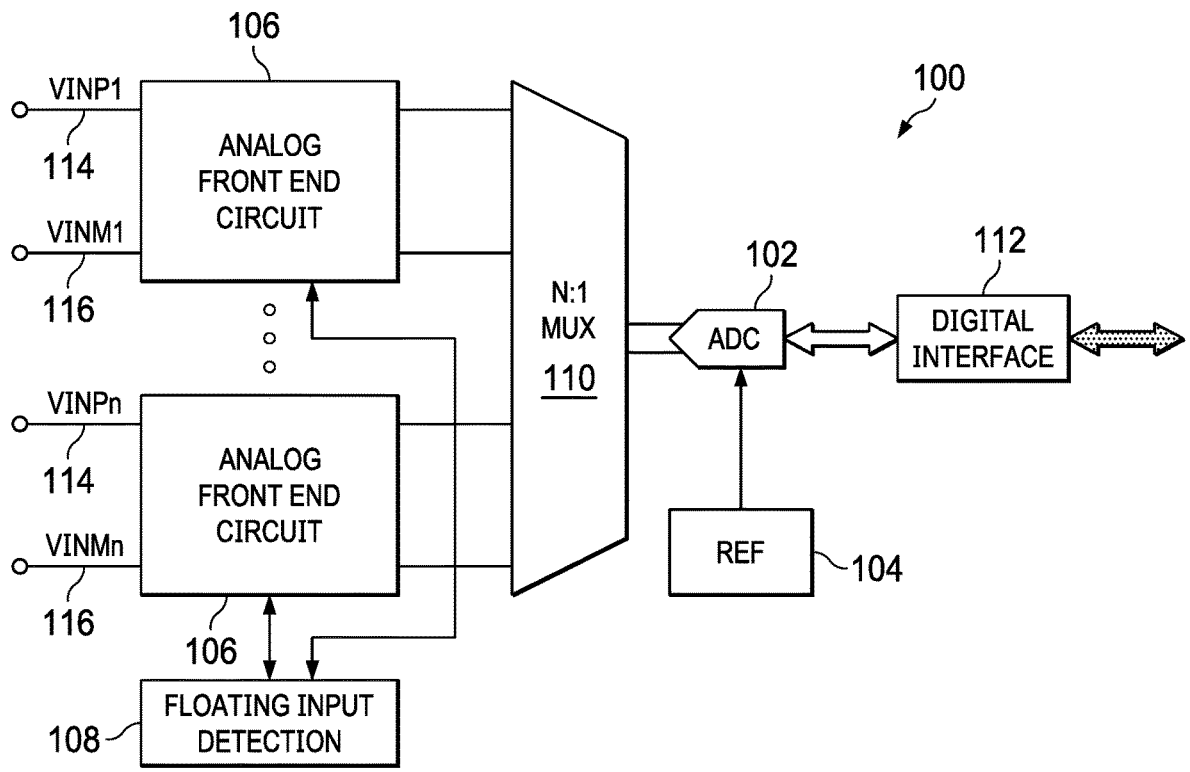
FIG. 1 shows a block diagram of an example of a data acquisition system that includes floating input detection in accordance with the present disclosure.

FIG. 1 shows a block diagram of an example of a data acquisition system 100 that includes floating input detection in accordance with the present disclosure. The data acquisition system 100 includes an analog-to-digital converter (ADC) 102, a voltage reference circuit 104, one or more AFE circuit 106, and floating input detection circuitry 108. Some implementations of the data acquisition system 100 include an analog multiplexer 110 and digital interface circuitry 112. The ADC 102 is a successive approximation register (SAR) ADC or other type of ADC suitable to digitizing analog signals. The digital interface circuitry 112 provides for transfer of the digital signal values produced by the ADC 102 to circuitry external to the data acquisition system 100. For example, the digital interface circuitry 112, implements a serial peripheral interface or an inter-integrated circuit interface in some implementations. The voltage reference circuit 104 generates a reference voltage that the ADC 102 applies to digitize the analog signals. The analog multiplexer 110 selectively routes an analog signal from one of the AFE circuits 106 to the ADC 102. For example, a selection value received from external circuitry via the digital interface circuitry 112 controls routing of analog signals from the AFE circuit 106 to the ADC 102 in some implementations.

The AFE circuit 106 conditions a received input signal for digitization by the ADC 102. Each AFE circuit 106 is coupled to a signal input terminal 114 and a reference input terminal 116. The reference input terminal 116 connects a ground voltage to the data acquisition system 100 in some implementations. The signal input terminal 114 connects an input signal to be digitized to the data acquisition system 100. The AFE circuit 106 includes circuitry to process the input signal received at the signal input terminal 114 for digitization. For example, the AFE circuit 106 includes an amplifier to apply gain to the input signal. The AFE circuit 106 also includes circuitry that is used in detect whether the signal input terminal 114 is floating. The floating input detection circuitry 108 is coupled to the AFE circuit 106 and applies the circuitry of the AFE circuit 106 to determine whether the signal input terminal 114 is floating.

Figure 2:
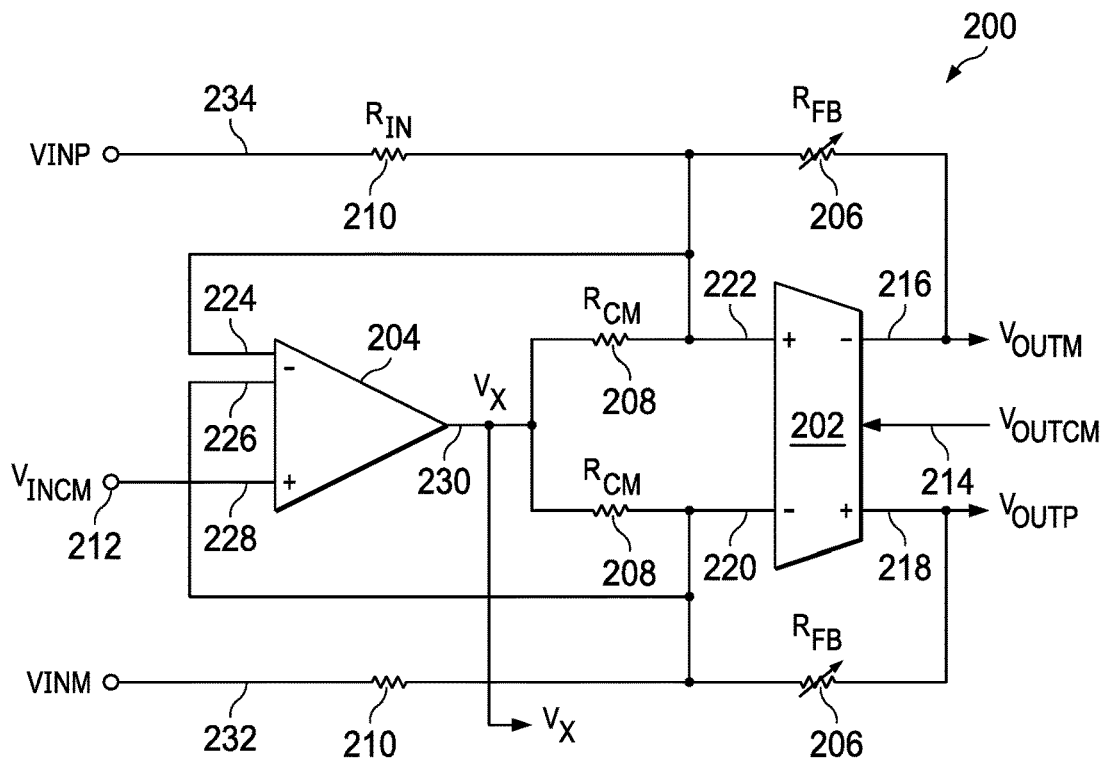
FIG. 2 shows a schematic diagram of an example of an analog front end (AFE) circuit suitable for use in detecting a floating input in accordance with the present disclosure.

FIG. 2 shows a schematic diagram of an AFE circuit 200. The AFE circuit 200 is an implementation of the AFE circuit 106. The AFE circuit 200 includes a programmable gain amplifier 202 and common mode amplifier 204 connected in a common mode loop. The programmable gain amplifier 202 is a differential amplifier having a non-inverting output 218, a non-inverting input 222, an inverting output 216, an inverting input 220, and a common mode input 214. The common mode input 214 is to receive a common mode output voltage to apply to the output signals produced at the inverting output 216 and the non-inverting output 218 of the programmable gain amplifier 202. The common mode amplifier 204 includes a non-inverting input 228, an inverting input 224, an inverting input 226, and an output 230. The inverting output 216 of the programmable gain amplifier 202 is coupled, via a first variable resistor 206, to the non-inverting input 222 of the programmable gain amplifier 202 and to the inverting input 224 of the common mode amplifier 204. The non-inverting output 218 of the programmable gain amplifier 202 is coupled, via a second variable resistor 206, to the inverting input 220 of the programmable gain amplifier 202 and to the inverting input 226 of the common mode amplifier 204. The resistance of the variable resistors 206 is variable to control the gain of the programmable gain amplifier 202.

The AFE circuit 200 includes a signal input terminal 234 and a reference input terminal 232. The signal input terminal 234 is an example of the signal input terminal 114, and the reference input terminal 232 is an example of the reference input terminal 116. The signal input terminal 234 is coupled, via a first input resistor 210, to the inverting input 224 of the common mode amplifier 204, and to the non-inverting input 222 of the programmable gain amplifier 202. The reference input terminal 232 is coupled, via a second input resistor 210, to the inverting input 226 of the common mode amplifier 204, and to the inverting input 220 of the programmable gain amplifier 202. The resistor 210 has a resistance of about 1 megohm in some implementations of the AFE circuit 200. In other implementations of the AFE circuit 200, the resistor 210 has a different resistance value.

The common mode input voltage terminal 212 of the AFE circuit 200 is connected to the non-inverting input 228 of the common mode amplifier 204. The common mode input voltage terminal 212 is to receive an input common mode voltage. The common mode amplifier 204 amplifies a difference of the input common mode voltage and an average of the signals received at the inverting input 224 and the inverting input 226. The average of the signals received at the inverting input 224 and the inverting input 226 is set equal to the input common mode voltage by the common mode feedback loop. The output 230 of the common mode amplifier 204 is coupled to the non-inverting input 222 of the programmable gain amplifier 202 by a resistor 208, and to the inverting input 220 of the programmable gain amplifier 202 by a resistor 208. The output 230 of the common mode amplifier 204 is also provided to the floating input detection circuitry 108 for use in detecting whether the signal input terminal 234 is floating. Signal provided by the common mode amplifier 204 on the output 230 is common mode and is rejected by the programmable gain amplifier 202.

Figure 3:
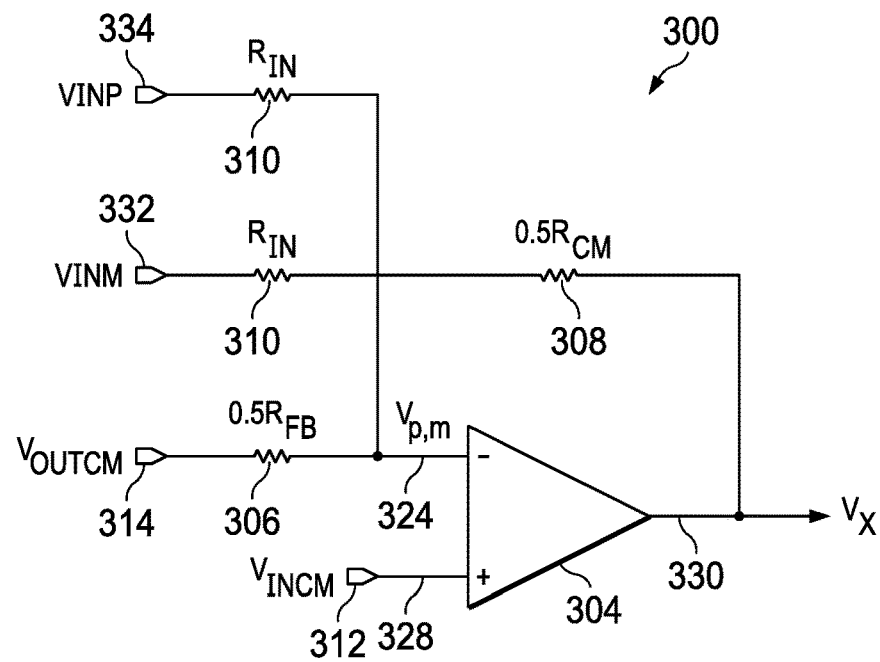
FIG. 3 shows an example of a common mode equivalent circuit corresponding to a portion of the AFE circuit of FIG. 2.

FIG. 3 shows an example a circuit equivalent to a portion (the common mode amplifier stage) of the AFE circuit 200. The equivalent circuit 300 includes an amplifier 304, a pair of resistors 310, a resistor 306, a resistor 308, a signal input terminal 334, a reference input terminal 332, an input common mode terminal 312, and an output common mode terminal 314. The input common mode terminal 312 is connected to the non-inverting input 328 of the amplifier 304. The resistor 308 couples the output signal input terminal 334 of the amplifier 304 to the inverting input 324 of the amplifier 304. The resistor 308 has resistance of one-half of the resistance of the resistor 208. The resistor 306 couples the output common mode terminal 314 to the inverting input 324 of the amplifier 304. The resistor 306 has resistance of one-half the resistance of the variable resistor 206. A first instance of the resistor 310 couples the signal input terminal 334 to the inverting input 324 of the amplifier 304. A second instance of the resistor 310 couples the reference input terminal 332 to the inverting input terminal 324 of the amplifier 304. The resistor 310 has the same resistance as the resistor 210. The signal at the output 330 of the amplifier 304 is the same as the signal at the output 230 of the amplifier 204.

The gain of the equivalent circuit 300 changes with the state of the signal input terminal 234. Based on analysis of the equivalent circuit 300, if the signal input terminal 234 is driven, the gain of the equivalent circuit 300 is:

$$G_D = \frac{V_X}{V_{INCM}} = 1 + R_{CM} * (G_{FB} + G_{IN})$$

where:
$G_D$ is the gain of the equivalent circuit 300 when the signal input terminal 234 is driven; $V_X$ is the output of the amplifier 204;
$V_{INCM}$ is the input common mode voltage received at the input common mode terminal 212;
$R_{CM}$ is the resistance of the resistor 208;
$G_{FB}$ is the conductance of the resistor 206; and
$G_{IN}$ is the conductance of the resistor 210.

If the signal input terminal 234 is floating, the gain of the equivalent circuit 300 is:

$$G_F = \frac{V_X}{V_{INCM}} = 1 + R_{CM} * \left(G_{FB} + \frac{G_{IN}}{2}\right)$$

where:
$G_F$ is the gain of the equivalent circuit 300 when the signal input terminal 234 is floating.

Implementations of the data acquisition system 100 evaluate the gain of the equivalent circuit 300 (i.e., gain from $V_{INCM}$ to $V_X$) to determine whether the signal input terminal 114 is floating. The data acquisition system 100 evaluates the gain of the equivalent circuit 300 in the voltage domain by comparing a change in output voltage $V_X$ ($\Delta V_X$) produced in response to a change in input common mode voltage $V_{INCM}$ ($\Delta V_{INCM}$) to a threshold voltage. The threshold voltage ($\Delta V_{TH}$) is a product of the change in $V_{INCM}$ and a gain threshold value ($V_{INCM}*G_T$), where $G_T$ is:

$$G_T = \frac{G_D + G_F}{2}$$

The comparison of $\Delta V_X$ to $\Delta V_{TH}$ is referred to herein as fine float detection, which is further explained in the following description.

Figure 4:
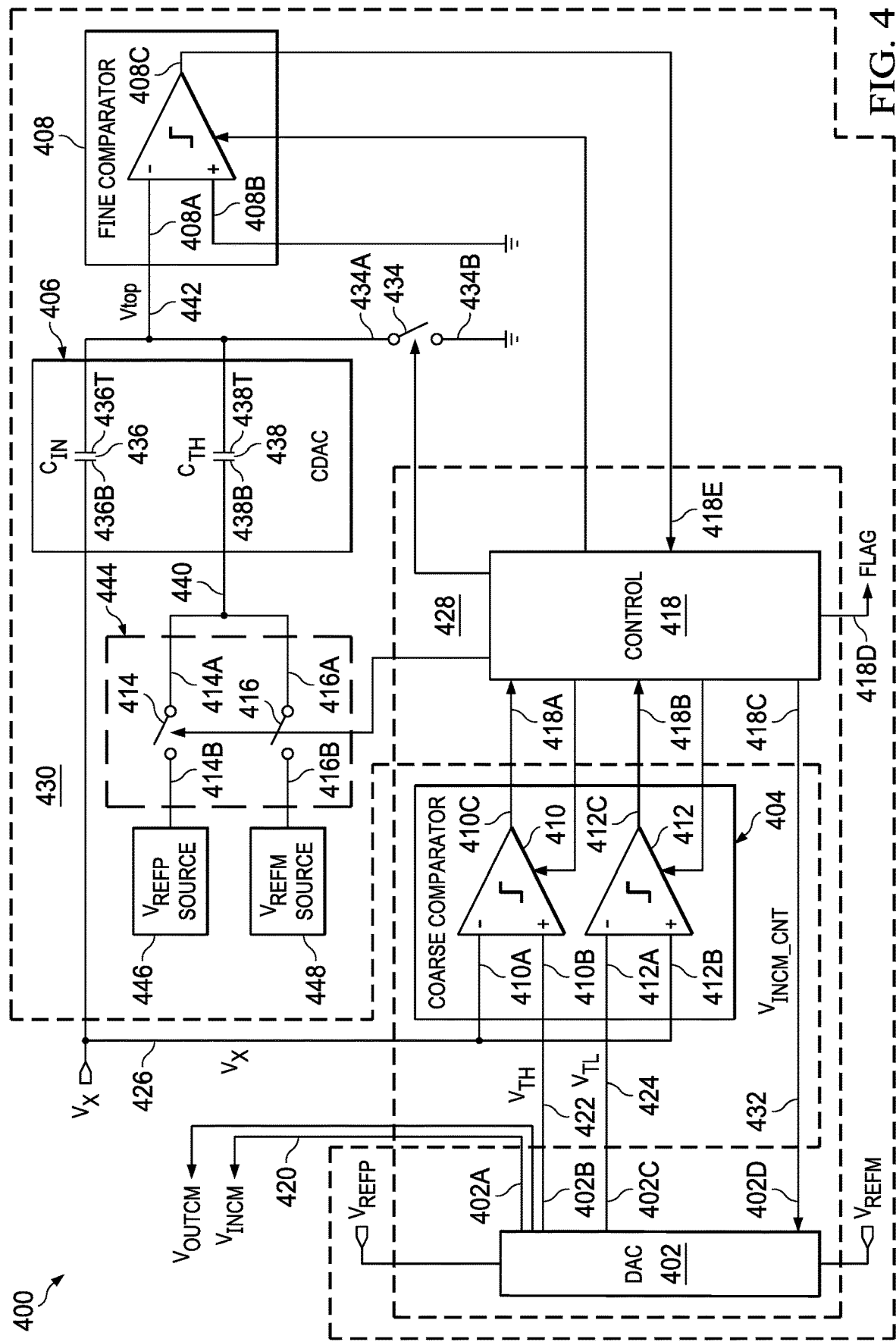
FIG. 4 shows block diagram for an example of floating input detection circuitry in accordance with the present disclosure.

FIG. 4 shows block diagram for an example of floating input detection circuitry 400 in accordance with the present disclosure. The floating input detection circuitry 400 is an implementation of the floating input detection circuitry 108. The floating input detection circuitry 400 includes coarse detection circuitry 428 and fine detection circuitry 430. The coarse detection circuitry 428 includes a digital-to-analog converter (DAC) 402, coarse comparator circuitry 404, and control circuitry 418. The fine detection circuitry 430 includes the DAC 402, a capacitive digital-to-analog converter (CDAC) 406, a fine comparator 408, reference voltage switching circuitry 444, a top plate switch 434, and the control circuitry 418. The reference voltage switching circuitry 444 includes a reference switch 414 and a reference switch 416. The reference switch 414 includes a first terminal 414A that is coupled to the bottom plate 438B of the capacitor 438 and a second terminal 414B that is coupled to a first reference voltage source 446. The reference switch 416 includes a first terminal 416A that is coupled to the bottom plate 438B of the capacitor 438 and a second terminal 416B that is coupled to a second reference voltage source 448. The top plate switch 434 includes a first terminal 434A that is coupled to the top plate 436T of the capacitor 436 and the top plate 438T of the capacitor 438, and a second terminal 434B that is coupled to ground. The fine comparator 408 includes a first input 408A that is coupled to the top plate 436T of the capacitor 436 and the top plate 438T of the capacitor 438, a second input 408B that is coupled to ground, and an output 408C that is coupled to an input 418E of the control circuitry 418. The control circuitry 418 is coupled to, and controls the operation of, the DAC 402, the coarse comparator circuitry 404, the reference switch 414, the reference switch 416, the top plate switch 434, and the fine comparator 408. The control circuitry 418 includes an output 418C that is coupled to an input 402D of the DAC 402, an output 418D that indicates whether the signal input terminal 114 is floating.

The DAC 402 is a resistive DAC, a capacitive DAC, a current DAC, or other type of DAC in various implementations of the floating input detection circuitry 400. Outputs of the DAC 402 are connected to the AFE circuit 200 and the coarse comparator circuitry 404. The DAC 402 generates the common mode input voltage 420 provided to the AFE circuit 200. An output 402A of the DAC 402 is coupled to one of the programmable gain amplifier 202 or the common mode amplifier 204. The voltage of the common mode input voltage 420, generated by the DAC 402, is controlled by the control circuitry 418. The control circuitry 418 changes the voltage of the common mode input voltage 420 to evaluate the gain of the AFE circuit 200.

The floating input detection circuitry 400 applies a coarse determination and a fine determination to identify the state of the signal input terminal 114. The coarse determination is provided by the coarse detection circuitry 428. In the coarse detection circuitry 428, the control circuitry 418 determines whether the signal input terminal 114 is driven by comparing the output signal 426 to two threshold values. The DAC 402 is coupled to the coarse comparator circuitry 404 and provides threshold voltage 422 and threshold voltage 424 to the coarse comparator circuitry 404. The coarse comparator circuitry 404 includes a comparator 410 and a comparator 412. The comparator 410 compares the output signal 426 generated by the common mode amplifier 204 to a high threshold voltage 422, provided by the DAC 402, and the comparator 412 compares the output signal 426 to a low threshold voltage 424 provided by the DAC 402. The comparator 410 includes a terminal 410A that is coupled to the output 230 of the common mode amplifier 204, and a terminal 410B that is coupled to an output 402B of the DAC 402. An output 410C of the comparator 410 is coupled to an input 418A of the control circuitry 418. The comparator 412 includes a terminal 412A that is coupled to the output 230 of the common mode amplifier 204, and a terminal 412B that is coupled to an output 402C of the DAC 402. An output 412C of the comparator 412 is coupled to an input 418B of the control circuitry 418.

If the signal input terminal 234 is driven with a relatively large signal (e.g., +/−10 volt signal swing), then the output signal 426 will also have a large swing (e.g., from power supply rail to power supply rail). If the signal input terminal 234 is floating, then no current flows in the resistor 210 and the output signal 426 will be a predetermined voltage. Similarly, if the signal input terminal 234 is driven with a voltage that is the same as the input common mode voltage on the common mode input voltage terminal 212, then the output signal 426 will be the same predetermined voltage generated when the signal input terminal is floating. The threshold voltage 422 is higher than the predetermined voltage, and the threshold voltage 424 is lower than the predetermined. If the output signal 426 is greater than the threshold voltage 422 or less than the threshold voltage 424, then an output of the coarse comparator circuitry 404 indicates that the signal input terminal 234 is driven rather than floating. If the output signal 426 is not greater than the threshold voltage 422 or not less than the threshold voltage 424, then an output of the coarse comparator circuitry 404 indicates that the signal input terminal 234 is possibly floating.

Figure 5:
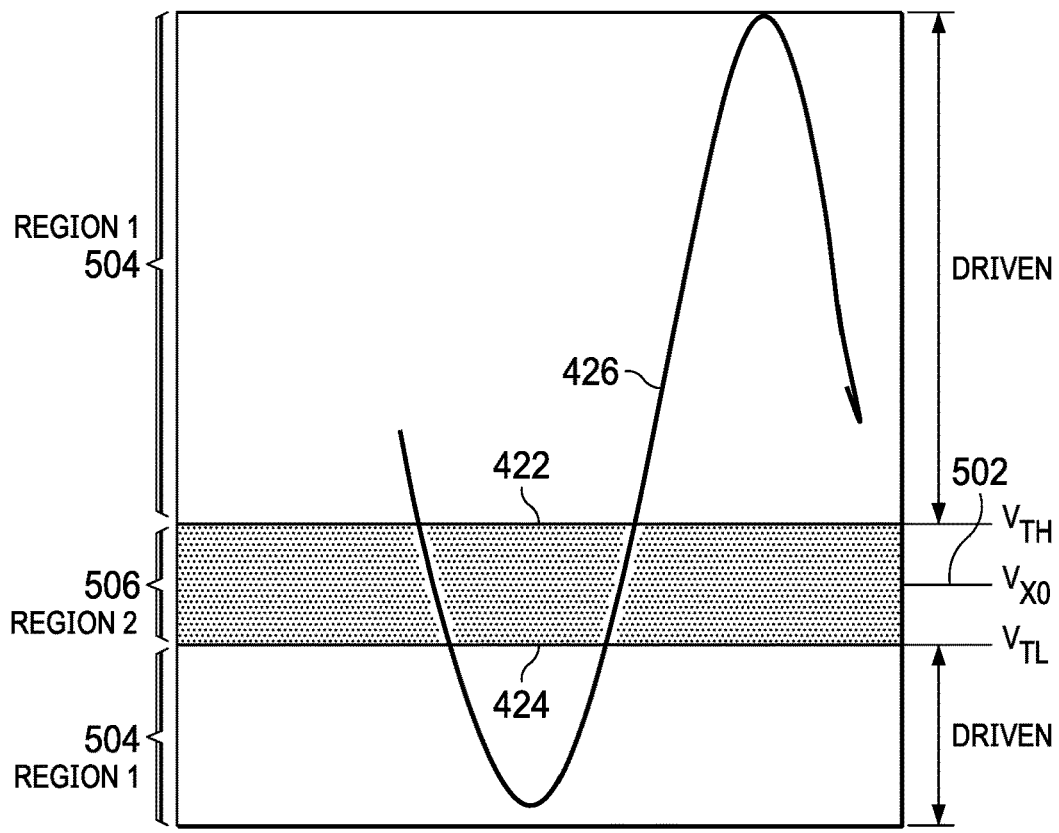
FIG. 5 shows an illustration of an example of coarse float detection in accordance with the present disclosure.

FIG. 5 shows an illustration of an example of coarse float detection in accordance with the present disclosure. In FIG. 5, the threshold voltage 422 and the threshold voltage 424 are set about the predetermined voltage 502. If the output signal 426 is greater than the threshold voltage 422 or less than the threshold voltage 424, then the output signal 426 falls in a first amplitude region 504 that indicates the signal input terminal 234 is not floating. However, if the output signal 426 is not greater than the threshold voltage 422 or less than the threshold voltage 424, then the output signal 426 falls in a second amplitude region 506 that indicates the signal input terminal 234 is possibly floating. Thus, coarse determination alone is sufficient to determine whether the signal input terminal 234 is not floating if the signal at the signal input terminal 234 is greater than the threshold voltage 422 or less than the threshold voltage 424. However, coarse determination cannot determine whether the signal input terminal 234 is floating if the signal at the signal input terminal 234 is not greater than the threshold voltage 422 or less than the threshold voltage 424. Implementations of the floating input detection circuitry 400 first apply coarse determination to determine whether the signal input terminal 234 is not floating, and if the coarse determination is inconclusive, apply fine determination. Use of the two-state detection process (coarse determination followed by fine determination if coarse determination is inconclusive) allows for fast and low-power detection of floating inputs with a variety of input signals.

If coarse detection is inconclusive as to whether the signal input terminal 114 is not floating, then the floating input detection circuitry 400 applies the fine detection circuitry 430 to determine whether the signal input terminal is driven. In the fine detection circuitry 430, the control circuitry 418 determines whether the signal input terminal 114 is driven by evaluating the gain of common mode amplifier stage (i.e., the gain from $V_{INCM}$ to $V_X$) of the AFE circuit 200 or the equivalent circuit 300. The fine detection compares multiple samples of the output signal 426 to determine whether the signal input terminal 234 is floating or driven. Each sample of the output signal 426 is acquired with a different input common mode voltage 420 applied at the common mode input voltage terminal 212. For example, prior to acquiring a sample of the output signal 426, the control circuitry 418 generates control signals 432 that cause the DAC 402 to change the common mode input voltage 420 applied at the common mode input voltage terminal 212. Changing the common mode input voltage 420 does not affect the differential output of the AFE circuit 200 because the common mode input voltage 420 is rejected as common mode. In conjunction with setting the common mode input voltage 420, the control circuitry 418 closes one of the reference switch 414 and the reference switch 416 provide a reference voltage to the CDAC 406. The CDAC 406 includes a capacitor 436 and a capacitor 438. The capacitor 436 has a bottom plate 436B that is coupled to the output 230 of the common mode amplifier 204 and a top plate 436T that is coupled to the comparator 408. The capacitor 438 has a bottom plate 438B that is coupled to the reference voltage switching circuitry 444 and a top plate 438T that is coupled to the comparator 408 and the top plate 436T of the capacitor 436. The control circuitry 418 closes the top plate switch 434 (i.e., connects the top plate 436T of the first capacitor 436 and the top plate 438T of the second capacitor 438 to ground) to charge the capacitor 436 of the CDAC 406 to the voltage of the output signal 426 and to charge the capacitor 438 of the CDAC 406 to the reference voltage 440 provided via the reference switch 414 or the reference switch 416. Thereafter, the top plate switch 434 is opened, the common mode input voltage 420 is changed, and reference voltage 440 is changed by changing which of the reference switch 414 and the reference switch 416 is closed. The output (i.e., the top plate voltage 442) of the CDAC 406 is:

$$\alpha(\Delta V_{Xmeas} - \Delta V_{TH})$$

where:

α is an attenuation factor;

$\Delta V_{Xmeas}$ is the difference in voltage of the output signal 426 with two values of the common mode input voltage 420; and $\Delta V_{TH}$ is the difference of two reference voltages generated in the CDAC 406.

Figure 6:
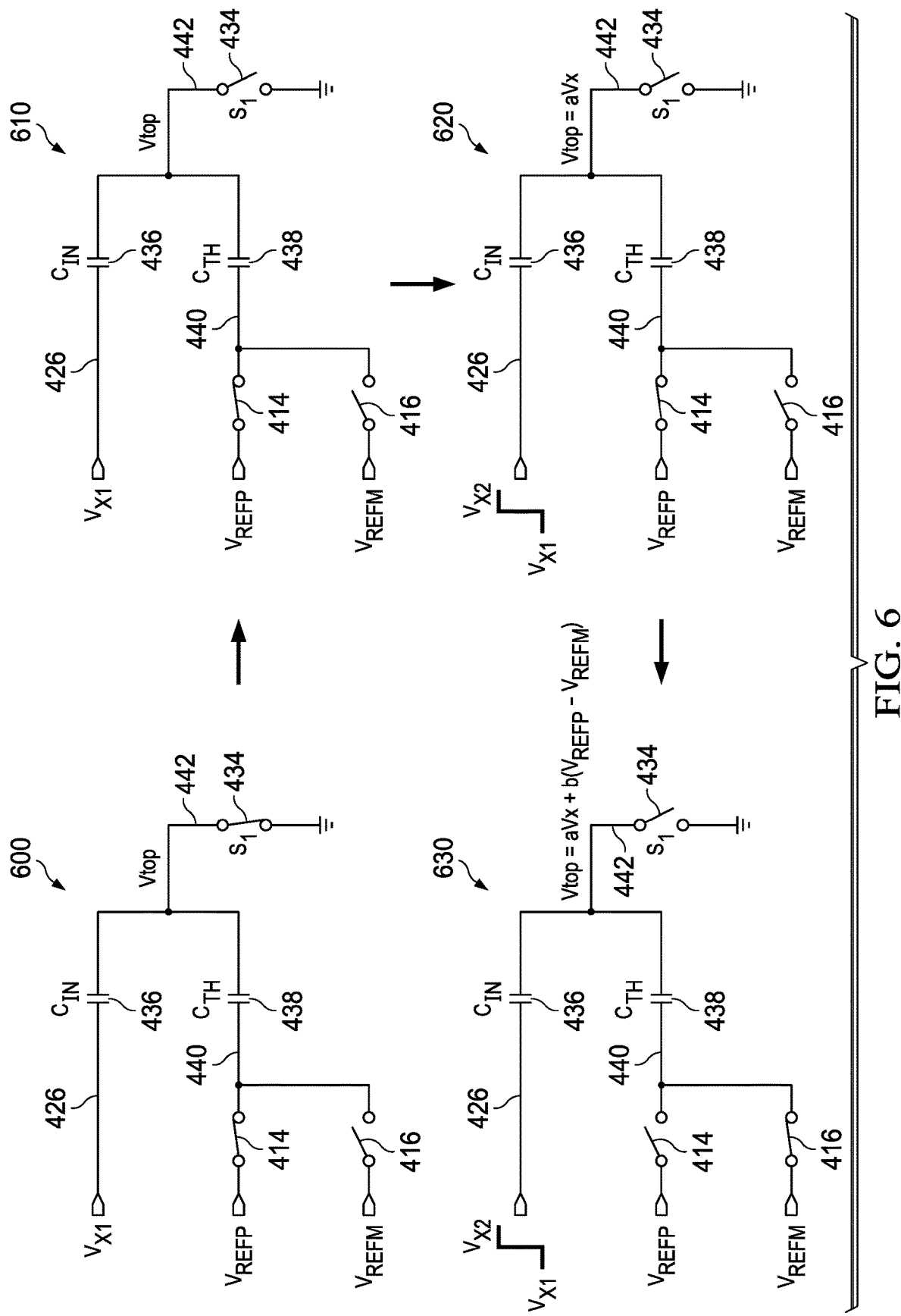
FIG. 6 shows an illustration of an example of fine float detection in accordance with the present disclosure.

FIG. 6 shows an example of fine float detection in accordance with the present disclosure. In configuration 600, the common mode input voltage 420 has been set, and the reference switch 414, the reference switch 416, and the top plate switch 434 are set to acquire a sample of the output signal 426 and the reference voltage 440. Selection of which of the reference switch 414 and the reference switch 416 are closed in the configuration 600 is based on the direction of change to be produced in the common mode input voltage 420 in configuration 620. If the voltage of the common mode input voltage 420 is to be increased in the configuration 620, then the reference switch 414 is closed and the reference switch 416 is open in the configuration 600. Similarly, if the voltage of the common mode input voltage 420 is to be decreased in the configuration 620, then the reference switch 416 is closed and the reference switch 414 is open in the configuration 600.

After expiration of a sample acquisition time, in configuration 610, the top plate switch 434 is opened to disconnect the top plate 436T of capacitor 436 and the top plate 438T of the capacitor 438 from ground.

In configuration 620, the common mode input voltage 420 is changed (e.g., increased). That is the control circuitry 418 provides the control signals 432 to the DAC 402 which changes the common mode input voltage 420, and in turn, changes the output signal 426. The top plate voltage 442 is:

$$\frac{C_{IN}}{C_{IN}+C_{TH}}(V_{X2}-V_{X1})$$

where:
$C_{IN}$ is the capacitance of the capacitor 436;
$C_{TH}$ is the capacitance of the capacitor 438;

$$\frac{C_{IN}}{C_{IN}+C_{TH}}$$

is the attenuation factor α.
$V_{X1}$ is the voltage of the output signal 426 in configuration 600 and configuration 610; and
$V_{X2}$ is the voltage of the output signal 426 in configuration 620 and configuration 630.

In configuration 630, the control circuitry 418 opens the reference switch 414 and closes the reference switch 416 to change the reference voltage 440 provided to the capacitor 438. The top plate voltage 442 is:

$$\left(\frac{C_{IN}}{C_{IN}+C_{TH}}(V_{X2}-V_{X1})\right)+\left(\frac{C_{TH}}{C_{IN}+C_{TH}}(V_{REFP}-V_{REFM})\right)$$

where:
$V_{REFP}$ is the voltage of the reference voltage 440 in configuration 600, configuration 610, and configuration 620;
$V_{REFM}$ is the voltage of the reference voltage 440 in configuration 630; and $$\frac{C_{TH}}{C_{IN}}(|V_{REFP}-V_{REFM}|) \text{ is } \Delta V_{TH}.$$

$\Delta V_{TH}$ is related to $\Delta V_{INCM}$, $G_D$, and $G_F$ as:

$$\frac{C_{TH}(V_{REFP}-V_{REFM})}{C_{IN}}=\frac{\Delta V_{INCM}(G_D+G_F)}{2}$$

The fine comparator 408 compares the top plate voltage 442 to ground to determine whether the gain from $V_{INCM}$ to $V_X$ (in the AFE circuit 200 or the equivalent circuit 300) exceeds a predetermined gain value (e.g., a gain value corresponding to the gain from $V_{INCM}$ to $V_X$ if the signal input terminal 234 is floating). In some implementations floating input detection circuitry 400, the control circuitry 418 changes the common mode input voltage 420 pseudo-randomly and/or performs multiple iterations of comparison of two different values of the output signal 426 to ensure that changes in the common mode input voltage 420 does not follow any signal voltage that is present at the signal input terminal 234. Thus, the control circuitry 418 avoids false detection of the signal input terminal 234 as floating.

Figure 7:
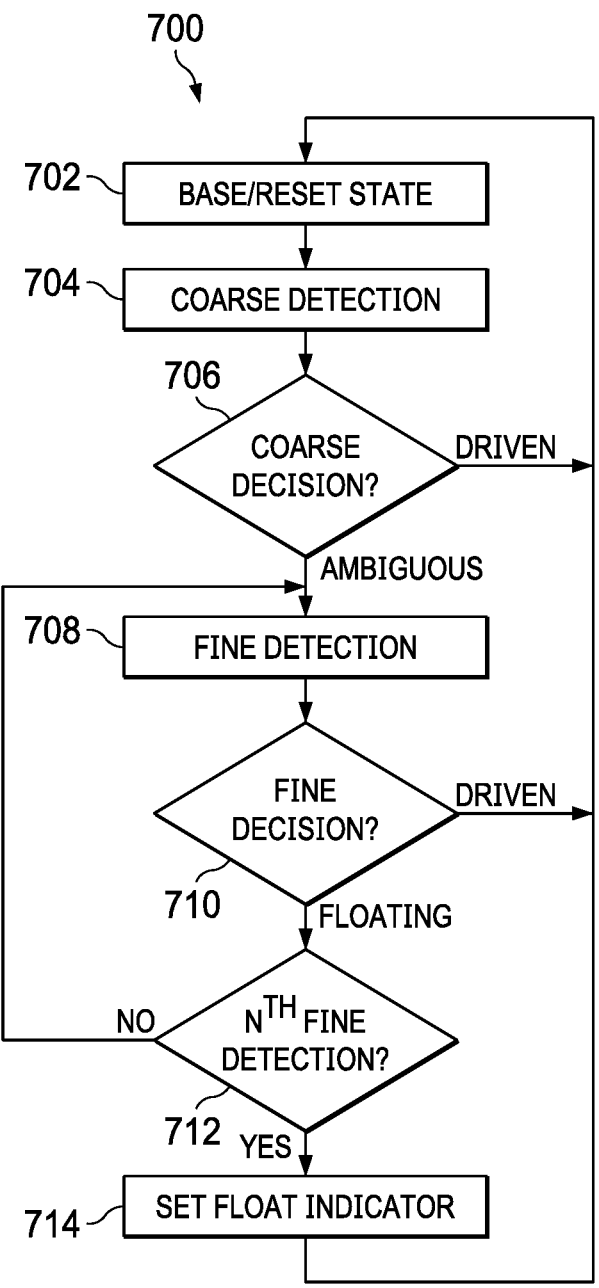
FIG. 7 shows a flow diagram for a method for floating input detection in accordance with the present disclosure.

FIG. 7 shows a flow diagram for a method 700 for floating input detection in accordance with the present disclosure. Though depicted sequentially as a matter of convenience, at least some of the actions shown can be performed in a different order and/or performed in parallel. Additionally, some implementations may perform only some of the actions shown. Operations of the method 700 may be performed by implementations of the data acquisition system 100.

In block 702, the floating input detection circuitry 108 is set to a base or reset state. A float indicator (e.g., a float flag bit) corresponding to the signal input terminal 234 is reset. A common mode input voltage 420 is provided to the common mode amplifier 204. The switches 414, 416, and 424 are set as per the configuration 600. An output signal 426 generated by the common mode amplifier 204 is provided to the coarse detection circuitry 428, the fine detection circuitry 430, the non-inverting input 222 of the programmable gain amplifier 202, and the inverting input 220 of the programmable gain amplifier 202.

In block 704, the floating input detection circuitry 108 performs a coarse detection to determine whether the signal input terminal 234 is driven. The coarse detection includes comparing the output signal 426 generated by the common mode amplifier 204 to a threshold voltage 422 and a threshold voltage 424.

In block 706, if the coarse detection indicates that the signal input terminal 234 is being driven (i.e., is not floating), then the control circuitry 418 continues floating input detection by going back to block 702. The signal input terminal 234 is determined to be driven if the output of the common mode amplifier 204 is greater than the threshold voltage 422 or less than the threshold voltage 424.

If in block 706, the coarse detection indicates that the state of the signal input terminal 234 is ambiguous (i.e., the signal input terminal 234 may be driven or floating), then the floating input detection circuitry 108 performs fine detection in block 708 to determine whether the common mode amplifier stage (e.g., the equivalent circuit 300) indicates that the signal input terminal 234 is floating. The fine detection includes repetitively acquiring a sample of the output signal 436 and a sample of a reference voltage 440 on the CDAC 406. The common mode input voltage 420 and the reference voltage 440 is changed for each iteration of the fine detection. The top plate voltage 442 of the CDAC 406 is compared to ground.

In block 710, if the fine detection indicates that the signal input terminal 234 is being driven (i.e., the top plate voltage 442 is higher than ground), then the control circuitry 418 continues floating input detection by going back to block 702.

If, in block 710, the fine detection indicates that the signal input terminal 234 is floating (i.e., the top plate voltage 442 is not higher than ground), then, in block 712, the floating input detection circuitry 108 determines whether the fine detection of block 708 has been executed a predetermined number of times. If the fine detection of block 708 has been executed a predetermined number of times, each time indicating that the signal input terminal 234 is floating, then the float indicator for the signal input terminal 234 is set in block 714. If the fine detection of block 708 has not been executed the predetermined number of times, then fine detection continues in block 708. Requiring that multiple consecutive fine detections indicate that the signal input terminal 234 is floating reduces false detection of a floating condition.

Figure 8:
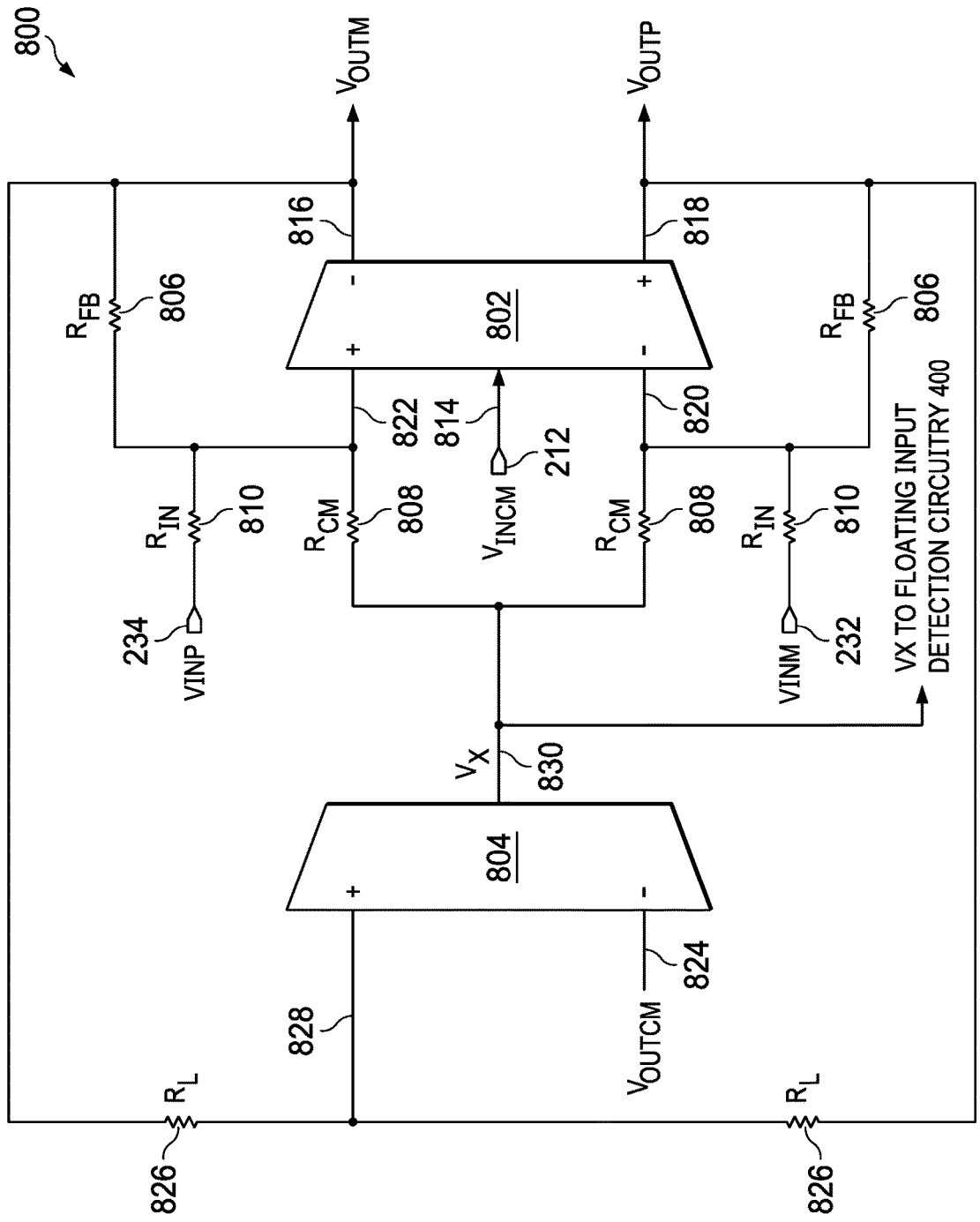
FIG. 8 shows a schematic diagram of a second example of an AFE circuit suitable for use in detecting a floating input in accordance with the present disclosure.

FIG. 8 shows a schematic diagram of a second example of an AFE circuit 800 that is suitable for use in detecting a floating input in accordance with the present disclosure. The AFE circuit 800 is an implementation of the AFE circuit 106. The AFE circuit 800 includes a programmable gain amplifier 802 and common mode amplifier 804 connected in a common mode loop. The AFE circuit 800 senses the common mode voltage at the output of the programmable gain amplifier 802 and corrects the common mode voltage via the common mode loop. As with the AFE circuit 200, the transfer function difference from $V_{INCM}$ to $V_X$ is used by the floating input detection circuitry 400 determine whether the signal input terminal 234 is floating.

The programmable gain amplifier 802 is a differential amplifier having a non-inverting output 818, a non-inverting input 822, an inverting output 816, an inverting input 820, and a common mode input 814. The common mode input 814 is to receive a common mode input voltage and is coupled to the common mode input 214. The common mode amplifier 804 includes a non-inverting input 828, an inverting input 824, and an output 830. The inverting output 816 of the programmable gain amplifier 802 is coupled, via a first variable resistor 806, to the non-inverting input 822 of the programmable gain amplifier 802 and, via a first resistor 826, to the non-inverting input 828 of the common mode amplifier 804. The non-inverting output 818 of the programmable gain amplifier 802 is coupled, via a second variable resistor 806, to the inverting input 820 of the programmable gain amplifier 802, and, via a second resistor 826, to the non-inverting input 828 of the common mode amplifier 804. The resistance of the variable resistors 806 is variable to control the gain of the programmable gain amplifier 802.

The AFE circuit 800 includes a signal input terminal 234 and a reference input terminal 232. The signal input terminal 234 is an example of the signal input terminal 114, and the reference input terminal 232 is an example of the reference input terminal 116. The signal input terminal 234 is coupled, via a first input resistor 810, to the non-inverting input 822 of the programmable gain amplifier 802. The reference input terminal 232 is coupled, via a second input resistor 810, to the inverting input 820 of the programmable gain amplifier 802.

The resistors 826 are coupled to the non-inverting input 828 of the common mode amplifier 804, and average signal received from the inverting output 816 and the non-inverting output 818 of the programmable gain amplifier 802.

The common mode amplifier 804 amplifies a difference of the output common mode voltage received at the inverting input 824 and an average of the signals received from the programmable gain amplifier 802. The output 830 of the common mode amplifier 804 is coupled to the non-inverting input 822 of the programmable gain amplifier 802 by a resistor 808, and to the inverting input 820 of the programmable gain amplifier 802 by a resistor 808. The output 830 of the common mode amplifier 804 is also provided to the floating input detection circuitry 108 for use in detecting whether the signal input terminal 834 is floating. Signal provided by the common mode amplifier 804 on the output 830 is common mode and is rejected by the programmable gain amplifier 802.

Figure 9:
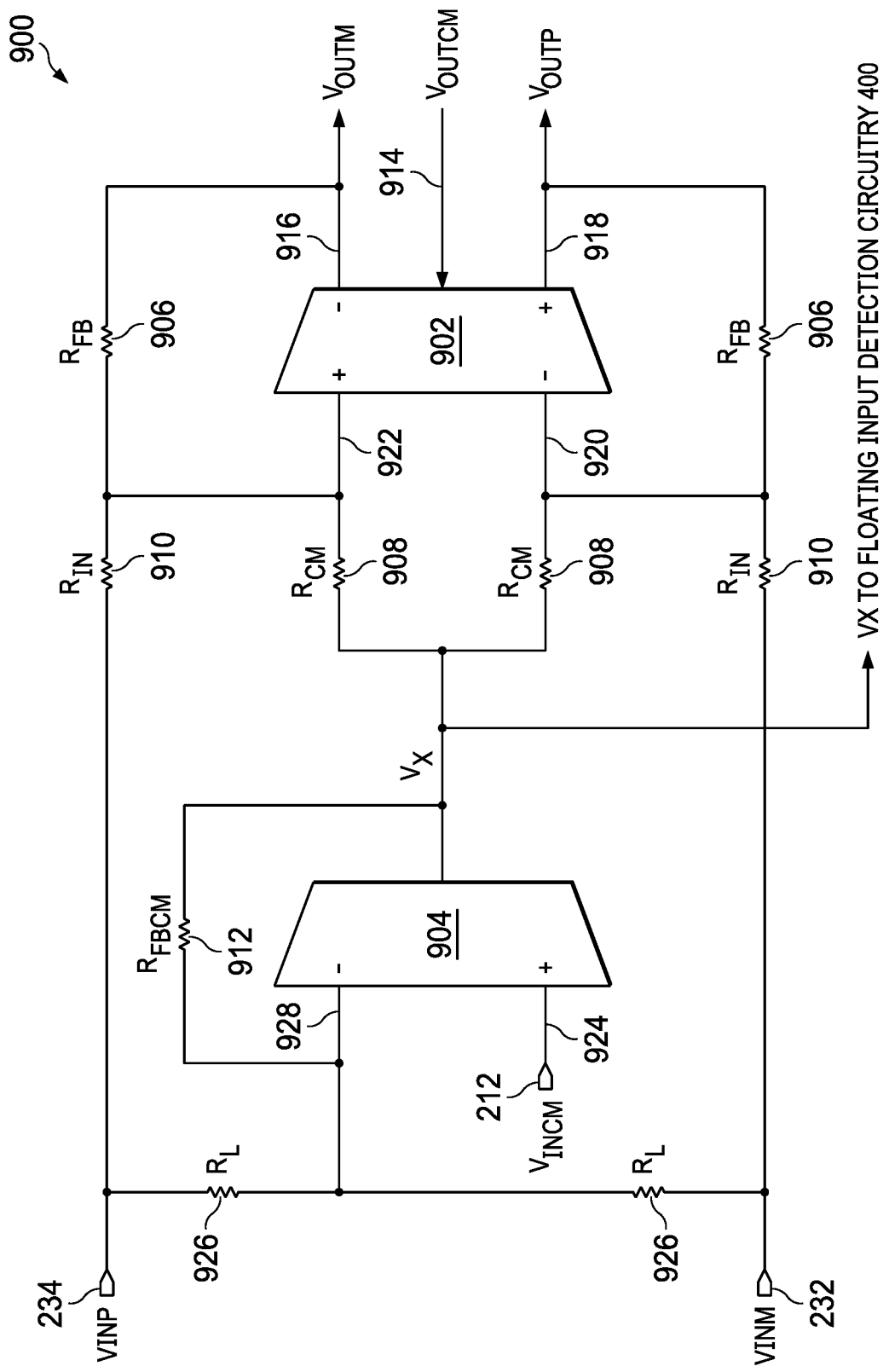
FIG. 9 shows a schematic diagram of a third example of an AFE circuit suitable for use in detecting a floating input in accordance with the present disclosure.

FIG. 9 shows a schematic diagram of a third example of an AFE circuit 900 that is suitable for use in detecting a floating input in accordance with the present disclosure. The AFE circuit 900 is an implementation of the AFE circuit 106. The AFE circuit 900 includes a programmable gain amplifier 902 and common mode amplifier 904 connected in a common mode loop. The AFE circuit 900 senses the common mode voltage at the input terminals 232 and 234 and corrects the common mode voltage via a feedforward path. As with the AFE circuit 200, the transfer function difference from $V_{INCM}$ to $V_X$ is used by the floating input detection circuitry 400 determine whether the signal input terminal 234 is floating.

The programmable gain amplifier 902 is a differential amplifier having a non-inverting output 918, a non-inverting input 922, an inverting output 916, an inverting input 920, and a common mode input 914. The common mode input 914 is to receive a common mode output voltage to apply to the output signals produced at the inverting output 916 and the non-inverting output 918 of the programmable gain amplifier 902. The common mode amplifier 904 includes an inverting input 928, a non-inverting input 924, and an output 930. The inverting output 916 of the programmable gain amplifier 902 is coupled, via a first variable resistor 906, to the non-inverting input 922 of the programmable gain amplifier 902 and, via a resistor 926, to the inverting input 928 of the common mode amplifier 904. The non-inverting output 918 of the programmable gain amplifier 902 is coupled, via a second variable resistor 906, to the inverting input 920 of the programmable gain amplifier 902, and, via a second resistor 926, to the inverting input 928 of the common mode amplifier 904. The resistance of the variable resistors 906 is variable to control the gain of the programmable gain amplifier 902.

The AFE circuit 900 includes a signal input terminal 234 and a reference input terminal 232. The signal input terminal 234 is an example of the signal input terminal 114, and the reference input terminal 232 is an example of the reference input terminal 116. The signal input terminal 234 is coupled, via a first input resistor 910, to the non-inverting input 922 of the programmable gain amplifier 902. The reference input terminal 232 is coupled, via a second input resistor 910, to the inverting input 920 of the programmable gain amplifier 902.

The resistors 926 are coupled to the inverting input 928 of the common mode amplifier 904, and average signal at the signal input terminal 234 and the reference input terminal 232.

The common mode amplifier 904 amplifies a difference of the output common mode voltage received at the non-inverting input 924 and an average of the signals received from the programmable gain amplifier 902. The output 930 of the common mode amplifier 904 is coupled to the inverting input 928 of the common mode amplifier 904 by a resistor 912, to the non-inverting input 922 of the programmable gain amplifier 902 by a resistor 908, and to the inverting input 920 of the programmable gain amplifier 902 by a resistor 908. The output 930 of the common mode amplifier 904 is also provided to the floating input detection circuitry 108 for use in detecting whether the signal input terminal 934 is floating. Signal provided by the common mode amplifier 904 on the output 930 is common mode and is rejected by the programmable gain amplifier 902.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A data acquisition system, comprising:
   a signal input terminal;
   an analog-to-digital converter (ADC);
   an analog front end (AFE) circuit coupled to the ADC and the signal input terminal, the AFE circuit comprising:
   a programmable gain amplifier; and
   a common mode amplifier coupled to the programmable gain amplifier, the common mode amplifier comprising:

a first input coupled to a non-inverting input of the programmable gain amplifier;
a second input coupled to an inverting input of the programmable gain amplifier;
a third input to receive a common-mode input voltage; and
an output coupled to the non-inverting input and the inverting input of the programmable gain amplifier; and
floating input detection circuitry coupled to the AFE circuit.

2. The data acquisition system of claim 1, wherein the floating input detection circuitry comprises coarse detection circuitry comprising:
a first comparator configured to compare the signal provided at the output of the common mode amplifier to a first threshold voltage; and
a second comparator configured to compare the signal provided at the output of the common mode amplifier to a second threshold voltage;
wherein the floating input detection circuitry is configured to find the signal input terminal to be not floating based on:
an output of the first comparator indicating that an amplitude of the signal provided at the output of the common mode amplifier is greater than the first threshold voltage; or
an output of the second comparator indicating that an amplitude of the signal provided at the output of the common mode amplifier is less than the second threshold voltage.

3. The data acquisition system of claim 2, wherein the floating input detection circuitry comprises a digital-to-analog converter coupled to the first comparator and the second comparator, the digital-to-analog converter configured to generate the first threshold voltage and the second threshold voltage.

4. The data acquisition system of claim 3, wherein the digital-to-analog converter is coupled to the common mode amplifier and is configured to generate the common-mode input voltage.

5. The data acquisition system of claim 2, wherein the floating input detection circuitry comprises fine detection circuitry configured to determine whether the signal input terminal is floating; wherein the floating input detection circuitry is configured to activate the fine detection circuitry responsive to the coarse detection circuitry determining that the amplitude of the signal provided at the output of the common mode amplifier is less than the first threshold voltage and greater than the second threshold voltage.

6. The data acquisition system of claim 5, wherein the fine detection circuitry is configured to determine whether the signal input terminal is floating based on a change in the amplitude of the signal provided at the output of the common mode amplifier as a function of a change in the common-mode input voltage.

7. The data acquisition system of claim 5, wherein the fine detection circuitry comprises:
reference voltage switching circuitry configured to selectively provide one of a plurality of reference voltages; and
a capacitive digital-to-analog converter (CDAC) comprising:
a first capacitor comprising a bottom plate coupled to the output of the common mode amplifier;
a second capacitor comprising:
a bottom plate coupled to the reference voltage switching circuitry; and
a top plate coupled to a top plate of the first capacitor;
a fine comparator configured to compare a voltage on the top plate of the first capacitor and the top plate of the second capacitor to ground;
a switch configured to selectably ground the top plate of the first capacitor and the top plate of the second capacitor.

8. The data acquisition system of claim 7, further comprising control circuitry configured to:
evaluate a gain of a common mode amplifier stage comprising the common mode amplifier by:
changing the common-mode input voltage to change the output of the common mode amplifier; and
selecting one of the reference voltages to provide to the CDAC based on whether the common mode input voltage is being increased;
determine whether the signal input terminal is floating based on the gain of the common mode amplifier stage.

9. The data acquisition system of claim 8, wherein the control circuitry is configured pseudo-randomly change the common-mode input voltage.

10. A method for detecting a floating signal input terminal, comprising:
providing a common-mode input voltage to a first amplifier coupled to the signal input terminal;
providing an output signal generated by the first amplifier to:
a non-inverting input of a second amplifier coupled to the signal input terminal;
an inverting input of the second amplifier;
coarse detection circuitry; and
fine detection circuitry;
comparing, by the coarse detection circuitry, the output signal to a first threshold voltage; and
determining the signal input terminal to be not floating responsive to the comparing indicating that the output signal is greater than the first threshold voltage.

11. The method of claim 10, further comprising:
comparing, by the coarse detection circuitry, the output signal to a second threshold voltage; and
determining the signal input terminal to be not floating responsive the comparing indicating that the output signal is less than the second threshold voltage.

12. The method of claim 11, further comprising:
responsive to not determining the signal input terminal to be not floating:
acquiring, by the fine detection circuitry, a sample of the output signal on a first capacitor of a capacitive digital-to-analog converter; and
acquiring, by the fine detection circuitry, a sample of a first reference voltage on a second capacitor of the capacitive digital-to-analog converter.

13. The method of claim 12, further comprising:
changing the common-mode input voltage provided to the first amplifier to change the output signal on the bottom plate of the first capacitor; and
applying a second reference voltage to the second capacitor.

14. The method of claim 13, further comprising comparing voltage on a top plate of the first capacitor and a top plate of the second capacitor to a ground voltage.

15. The method of claim 14, further comprising:
  determining the signal input terminal to be not floating responsive to the voltage on the top plate of the first capacitor and the top plate of the second capacitor being higher than the ground voltage; and
  setting the float indicator responsive to the voltage on the top plate of the first capacitor and the top plate of the second capacitor not being higher than the ground voltage.

16. A circuit for detecting a floating input, comprising:
  a signal input terminal;
  a reference terminal;
  a first amplifier: comprising:
    an inverting input coupled to the reference terminal; and
    a non-inverting input coupled to the signal input terminal;
  a second amplifier, comprising:
    a first input and a second input, wherein a non-inverting output and an inverting output of the first amplifier are coupled to the first input or the second input; and
    an output coupled to the inverting input of the first amplifier, and to the non-inverting input of the first amplifier;
  floating input detection circuitry comprising:
    a digital-to-analog converter comprising a first output coupled to one of the first amplifier or the second amplifier;
    a first comparator comprising:
      a first input coupled to the output of the second amplifier; and
      a second input coupled to a second output of the digital-to-analog converter;
    a second comparator comprising:
      a first input coupled to the output of the second amplifier; and
      a second input coupled to a third output of the digital-to-analog converter; and
    control circuitry comprising:
      a first input coupled to an output of the first comparator;
      a second input coupled to an output of the second comparator;
      a first output coupled to an input of the digital-to-analog converter; and
      a second output to indicate whether the signal input terminal is floating.

17. The circuit of claim 16, wherein the floating input detection circuit further comprises a capacitive digital-to-analog converter comprising:
  a first capacitor comprising a bottom plate coupled to the output of the second amplifier; and
  a second capacitor comprising a top plate coupled to a top plate of the first capacitor.

18. The circuit of claim 17, further comprising:
  a first switch comprising:
    a first terminal coupled to a bottom plate of the second capacitor; and
    a second terminal coupled to a first reference voltage source;
  a second switch comprising:
    a first terminal coupled to the bottom plate of the second capacitor; and
    a second terminal coupled to a second reference voltage source.

19. The circuit of claim 17, further comprising:
  a switch comprising:
    a first terminal coupled to the top plate of the first capacitor and to the top plate of the second capacitor; and
    a second terminal coupled to ground.

20. The circuit of claim 17, further comprising a fine comparator, the fine comparator comprising:
  a first input coupled to the top plate of the first capacitor and to the top plate of the second capacitor;
  a second input coupled to ground; and
  an output coupled to a third input of the control circuitry.

* * * * *